United States Patent
Crews

(10) Patent No.: US 7,295,590 B2
(45) Date of Patent: Nov. 13, 2007

(54) METHOD FOR MEASURING VCSEL REVERSE BIAS LEAKAGE IN AN OPTICAL MODULE

(75) Inventor: Darren S. Crews, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 302 days.

(21) Appl. No.: 10/989,175

(22) Filed: Nov. 15, 2004

(65) Prior Publication Data

US 2006/0104328 A1    May 18, 2006

(51) Int. Cl.
*H01S 5/00*   (2006.01)
*H01S 3/00*   (2006.01)

(52) U.S. Cl. .................... 372/50.124; 372/38.1
(58) Field of Classification Search ..... 372/50.1–50.23
See application file for complete search history.

(56) References Cited

U.S. PATENT DOCUMENTS

| | | | | |
|---|---|---|---|---|
| 5,568,502 | A * | 10/1996 | Hironaka | 372/50.1 |
| 5,757,027 | A * | 5/1998 | Kuchta | 257/48 |
| 6,246,708 | B1 * | 6/2001 | Thornton et al. | 372/50.124 |
| 6,567,439 | B1 * | 5/2003 | Auracher et al. | 372/36 |
| 6,583,445 | B1 | 6/2003 | Reedy et al. | |
| 6,791,257 | B1 * | 9/2004 | Sato et al. | 313/498 |
| 6,912,332 | B2 * | 6/2005 | Han et al. | 385/14 |
| 2002/0118924 | A1 * | 8/2002 | Murata | 385/52 |
| 2004/0005119 | A1 * | 1/2004 | Han et al. | 385/49 |
| 2004/0217265 | A1 * | 11/2004 | Bulteau | 250/214 R |
| 2004/0247004 | A1 * | 12/2004 | Keh et al. | 372/36 |
| 2005/0271334 | A1 * | 12/2005 | Funada | 385/92 |

FOREIGN PATENT DOCUMENTS

EP    0 933 842 A2    8/1999

OTHER PUBLICATIONS

Heinz-Christoph Neitzert, et al., "Sensitivity of Proton Implanted VCSELs to Electrostatic Discharge Pulses," IEEE Journal on Selected Topics in Quantum Electronics, vol. 7, No. 2, Mar./Apr. 2001, pp. 231-241.
Song, et al: Monolithic Arrays of Surface-Emitting Laser Nor Logic Devices; IEEE Phtonics Tech Letters, IEEE Service Center, Piscataway, NJ, US, vol. 5, No. 8, Aug. 1, 1993, XP000399640, ISSN: 1041-1135.
Neitzert: ESD-Induced Degradation of Vertical-Cavity Sruface-Emitting Lasers; Electronics Letters, IEE Stevenage, GB, vol. 36, No. 19, Sep. 14, 2000, XP006015706, ISSN: 0013-5194.
Pu, et al: Hybrid Integration of VCSEL's to CMOS Integrated circuits; IEEE Journal of Selected Topics in Quantum Electronics, IEEE Service Center, Piscataway, NJ, US, vol. 5, No. 2, Mar. 1999, XP000865281, ISSN: 1077-260X.
Int'l Application No.: PCT/US2005/041373 Int'l Search Report & Written Opinion dated May 30, 2006.

* cited by examiner

*Primary Examiner*—Minsun Oh Harvey
*Assistant Examiner*—Phillip Nguyen
(74) *Attorney, Agent, or Firm*—Kevin A. Reif

(57) ABSTRACT

Reverse bias leakage testing may be used to determine the health of a vertical cavity surface emitting laser (VCSEL). When VCSELs are integrated on a die with other electronic devices such testing may damage the other electronic devices or be prohibited by circuits on the die designed to protect the electronics from being reverse biased. Accordingly, reverse bias testing may be facilitated by providing a second ground pad, separate from the die ground pad, specific to the VCSEL.

8 Claims, 5 Drawing Sheets

METHOD FOR MEASURING VCSEL REVERSE BIAS LEAKAGE IN AN OPTICAL MODULE

FIELD OF THE INVENTION

Embodiments of the present invention relate to optics and, more particularly, to reverse bias testing of lasers.

BACKGROUND INFORMATION

Lasers are used in a wide variety of applications. In particular, lasers are integral components in optical communication systems where a beam modulated with vast amounts of information may be communicated great distances at the speed of light over optical fibers. More recently, lasers have been investigated for communicating information short distances, such as chip-to-chip in computing environments.

Of particular interest is the so-called vertical cavity surface emitting laser (VCSEL). As the name implies, this type of laser is a semiconductor micro-laser diode that emits light in a coherent beam orthogonal to the surface of a fabricated wafer. VCSELs are compact, relatively inexpensive to fabricate in mass quantities, and may offer advantages over more traditional edge emitting lasers. Edge emitting laser diodes emit coherent light parallel to the semiconductor junction layer. In contrast, VCSELs emit a coherent beam perpendicular to the boundaries between the semiconductor junction layers. Among other advantages, this may make it easier to couple the light beam to an optical fiber and may be more efficient.

FIG. 1 shows a cross-sectional view of a basic VCSEL 100 along with its symbolic representation 100'. The VCSEL 100 may include an inactive layer 101. Also shown is an active layer 102 comprising for example InGaAs, and optical confinement layers 104 comprising for example AlGaAs. These layers 102 and 104 may be sandwiched between a p-side semiconductor multi-layer reflector 106 (or p-side Distributed Bragg Reflector (DBR)), and an n-side semiconductor multi-layer reflector 108 (or n-side DBR). A resonator cavity is formed in the space between the p-DBR 106 and the n-DBR 108. A current flowing between an anode 110 and a cathode 112 excites laser oscillation such that generated laser light 114 may be emitted through a plane of the substrate 116. Of course other VCSEL configurations are possible.

As similarly discussed in, for example Reedy et al., U.S. Pat. No. 6,583,445, VCSELs may be efficiently fabricated on wafers using standard microelectronic fabrication processes and, as a result, may be integrated on-board with other components to combine both the silicon electronic and the optoelectronic devices in a single unit or integrated circuit (IC). However, since high-density CMOS electronic circuits are typically made in silicon and high performance optoelectronic devices such as VCSELs are typically made with various other optically active materials (e.g. III-V materials), such as GaAs and ZnSe, combining the two may not be entirely straight forward.

Attempts to integrate Si and III-V materials have been proposed. Heteroepitaxial growth for example involves the crystalline growth of one material on a dissimilar crystal substrate such as the heteroepitaxial growth of GaAs on silicon, and silicon on GaAs and has been done with some limited success.

More practical approaches may involve fabricating the CMOS electronic chips and optoelectronic chips separately and then later combining the two such as by epoxy casting to form what are referred to as multi-chip modules, or MCMs. Flip-chip bonding may be another approach where a chip is flipped over and attached to a substrate or other chip by a solder joint to join two dissimilar chips into intimate electrical and mechanical contact with each other to form a single module. However, when joined testing of the laser may be difficult.

DETAILED DESCRIPTION

Like many electronic and optoelectronic components, VCSELs are inherently prone to damage from electrostatic discharge (ESD). An ESD level of just 200 Volts can destroy a VCSEL. The device may not fail immediately, but after some time. This time could be a year or more depending on the operating conditions. Unfortunately, after an optoelectronic device has been integrated on-board with other silicon electronic devices, it may be difficult to test the VCSEL for damage such as that caused by an ESD event.

One test to determine if ESD damage has occurred is by doing a measure of the reverse bias leakage current of the VCSEL. If the leakage current is too high, this may signify that the p-n junction in the VCSEL has sustained some damage. Integrated designs where the VCSEL anode 110 and cathode 112 have been connected to an IC have not been able to measure this leakage current. A reason for this is that ESD diodes designed into the IC prevent reverse biasing of the IC. Therefore the VCSEL, now part of the IC, also cannot be reverse biased.

Figure 1:
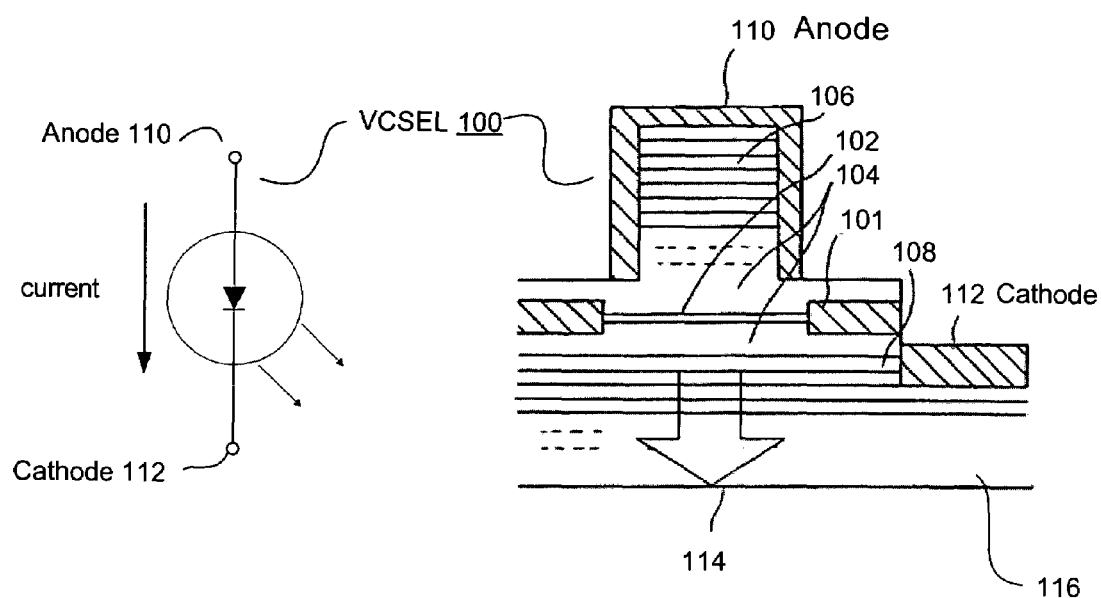
FIG. 1 is cutaway view of a vertical cavity surface emitting laser (VCSEL) diode and its symbolic representation.
Figure 2:
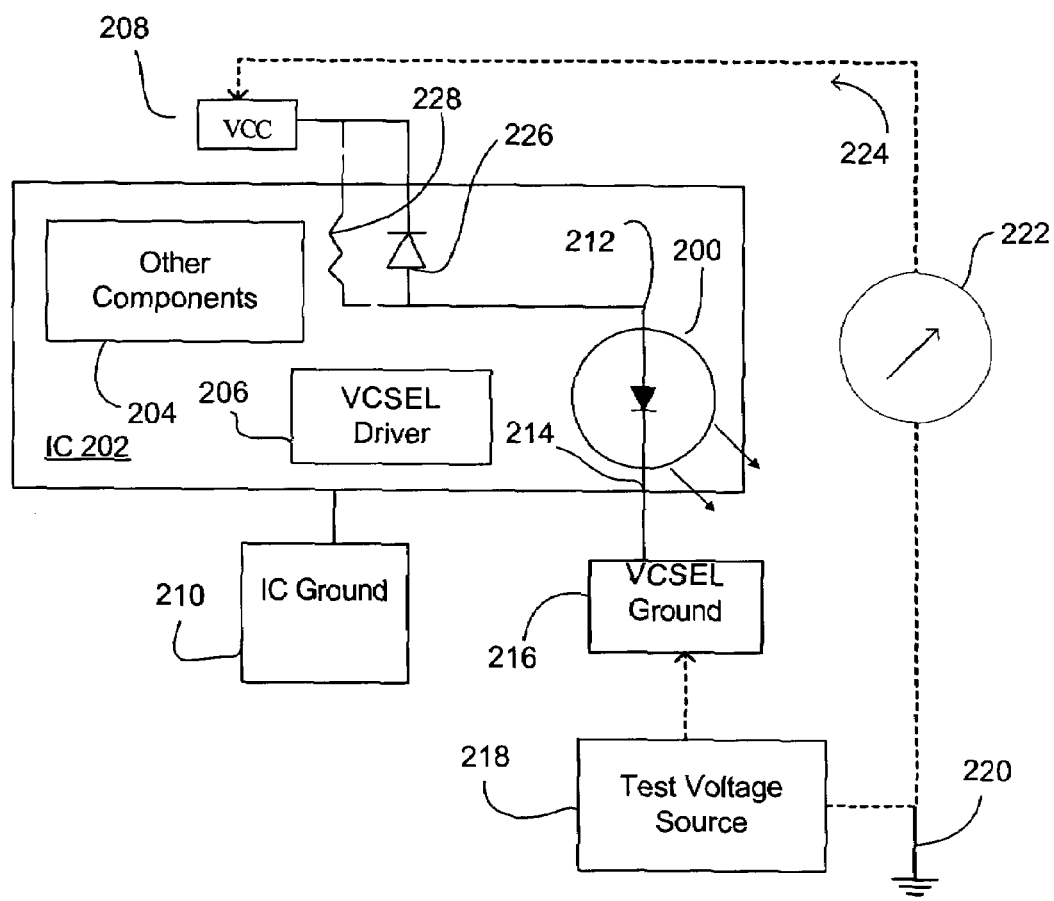
FIG. 2 is an integrated circuit (IC) module including a separate VCSEL ground for reverse bias testing according to one embodiment.

Referring now to FIG. 2, there is shown a block diagram of a VCSEL 200 integrated with an IC module 202 according to an embodiment of the invention. Other components 204 which may include MOS, CMOS or bi-polar devices may be integral to the IC module 202. In one embodiment, one of these other components may include a VCSEL driver 206 comprising the circuitry for operating the VCSEL 200. The VSCEL 200 may be integrally formed with the IC module 202, such as by heteroepitaxial growth, or may comprise a separate die that is epoxy bonded, flip-chip bonded, wire bonded or otherwise mechanically and electrically attached to the IC module 202.

The IC module 202 comprises an input voltage source (Vcc) 208 as well as an IC ground 210. As may be typical, during normal operation of the IC 202, Vcc 208 supplies the voltage to operate the various components including, in this example, the VCSEL 200, the VCSEL driver 206, as well as any other components 204 that may be present. Similarly, the IC ground 210 provides electrical grounding for the VSCEL driver and any other components 204.

According to one embodiment of the invention, the VCSEL 200 may have its anode 212 share Vcc 208 with the IC 202, however, the VCSEL cathode 214 may include its own ground 216, separate from the IC ground 210. Thus, the VCSEL cathode 214 may be electrically separated from the rest of the module package 202. This VCSEL ground 216 may comprises a pad or lead which may be accessible from outside the IC module 202 to be used for reverse bias testing of the VSCEL 200, such as to detect ESD damage. As shown, a conductive element such as, for example, a diode 226, or alternatively a resistor 228 may be provided to provide a conduction path between the anode 212 of the VCSEL 200 and the Vcc pad 208.

A reverse bias test may be performed using a test voltage source 218. During such a test, the VCSEL ground 216 may be supplied with a voltage, for example 5-10 Volts, and the Vcc pad 208 may be grounded 220. Of course the pad for Vcc 208 is disconnected from any voltage source during this test. Leakage current through the VCSEL 200 may be detected by a current meter 222 in the test path 224. For a typical VCSEL 200, a leakage current as small as a nano-amp may signify VCSEL 200 damage.

FIG. 2 shows a single VCSEL 200 integrated with the IC module 202. However, in one embodiment of the invention, the IC module 202 may comprise a plurality of VCSELs, such as a single die comprising an array of VCSELs or an array of individual VCSEL dies.

Figure 3:
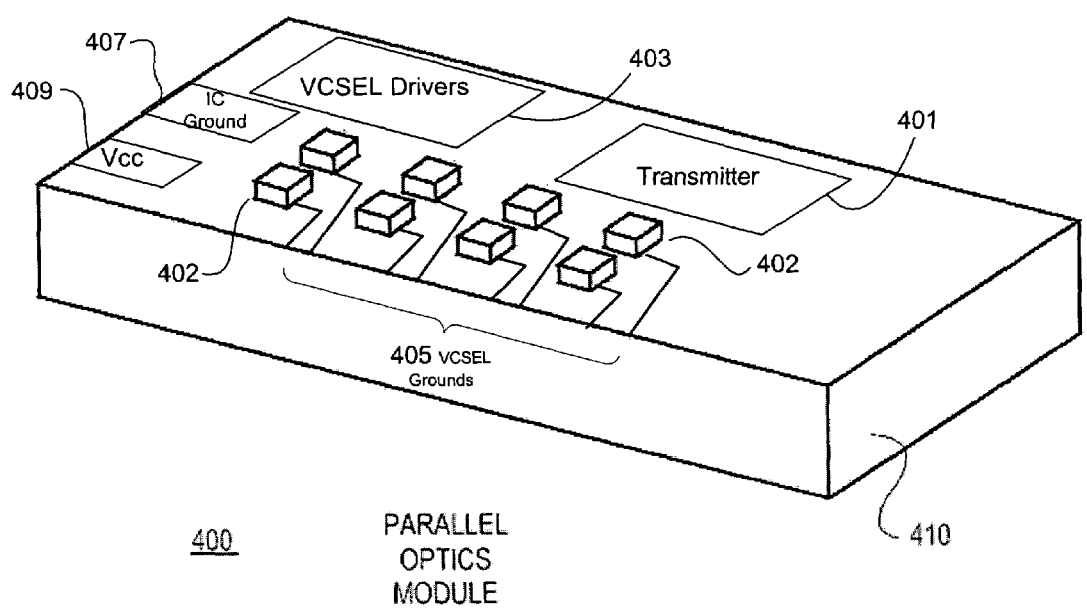
FIG. 3 is a plan view of a parallel optics module according to one embodiment of the invention.

FIG. 3 is illustrative of a parallel optics module 400, such as that disclosed in co-pending application Ser. No 10/938, 036.

Referring to FIG. 3, an embodiment of a parallel optics module 400 is shown. The parallel optics module 400 may include singulated VCSEL dies 402 arranged in a two-dimensional array. The singulated VCSEL dies 402 are coupled to a substrate 410 which may contain other components such as VCSEL drivers 403 and transmitter circuitry 401. It will be understood the two-dimensional die 402 array is not limited to the arrangement shown in FIG. 3. In one embodiment, each of the singulated VCSEL dies 402 may share Vcc 409 with the IC, but each may have its own accessible ground 405 separate from the IC ground 407 to enable reverse bias testing.

Figure 4:
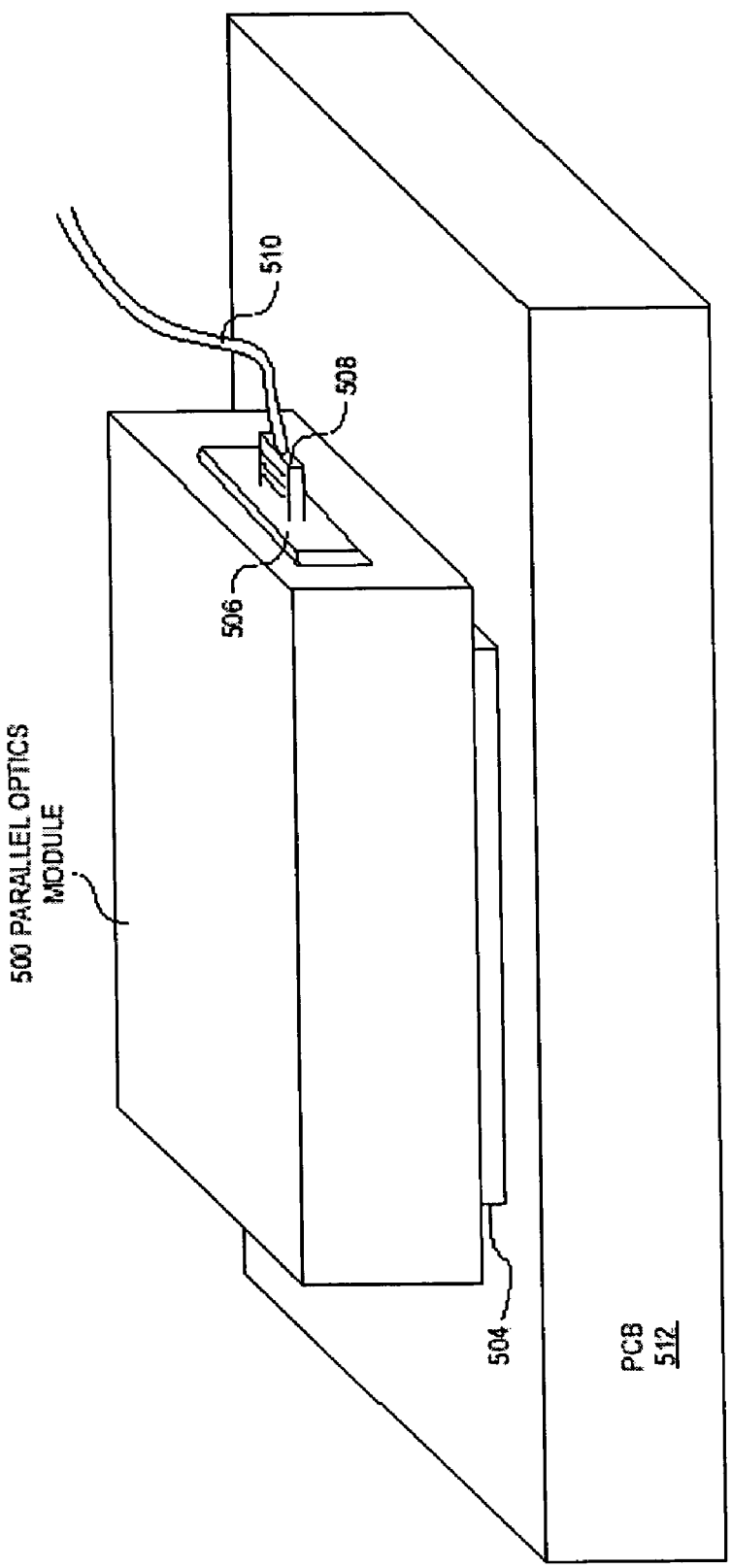
FIG. 4 is a parallel optics module according to one embodiment of the invention.

Referring to FIG. 4, an embodiment of a parallel optics module 500 coupled to a printed circuit board (PCB) 512 is shown. Parallel optics module 500 includes VCSEL dies with separate grounds as previously described. Parallel optics module 500 may include an optical transmitter, an optical receiver, or an optical transceiver.

Parallel optics module 500 includes an electrical connector 504 to couple module 500 to PCB 512. Electrical connector 504 may include a ball grid array (BGA), a pluggable pin array, a surface mount connector, or the like.

Parallel optics module 500 may include an optical port 506. In one embodiment, optical port 506 may include an optical port to receive a Multi-Fiber Push On (MPO) connector 508. MPO connector 508 may be coupled to an optical fiber ribbon 510. In one embodiment, the optical fiber ribbon 510 includes two or more plastic optical fibers.

In one embodiment, the singulated dies of parallel optics module 500 may emit light at different wavelengths for use in Wavelength Division Multiplexing (WDM). In one embodiment, parallel optics module 500 may transmit and/ or receive optical signals at approximately 850 nanometers (nm). In another embodiment, parallel optics module 500 may operate with optical signals having a transmission data rate of approximately 3-4 Gigabits per second (Gb/s) per channel. In yet another embodiment, optical signals transmitted and received by parallel optics module 500 may travel up to a few hundred meters. It will be understood that embodiments of the invention are not limited to the optical signal characteristics described herein.

Figure 5:
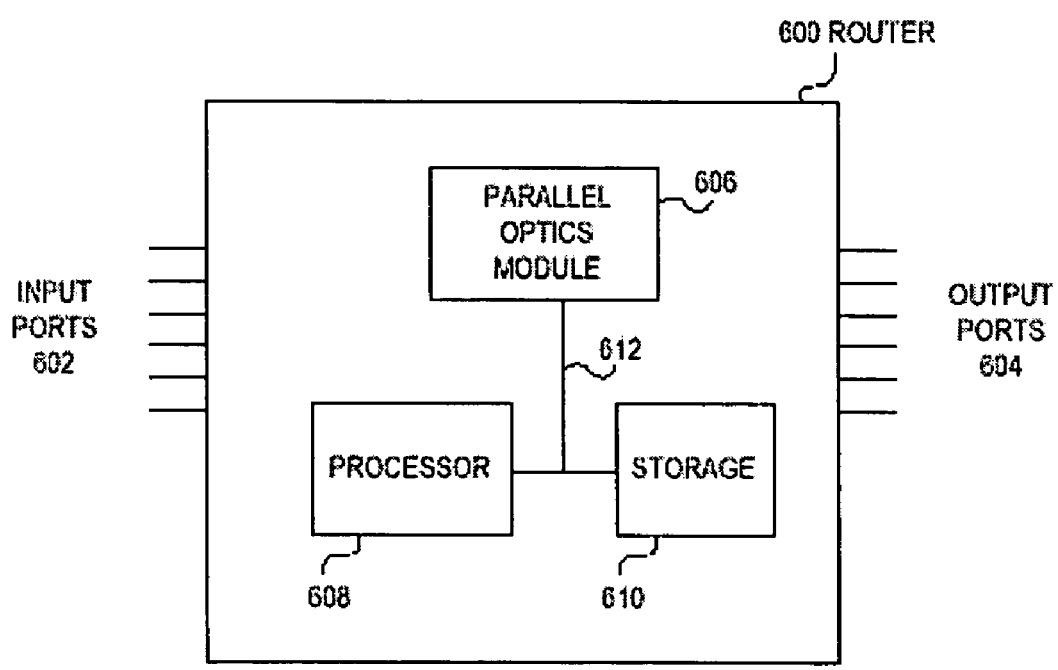
FIG. 5 is a router including an optics module according to one embodiment of the invention.

FIG. 5 illustrates an embodiment of a router 600. Router 600 includes a parallel optics module 606 included singulated dies as described herein. In another embodiment, router 600 may be a switch, or other similar network element. In an alternative embodiment, parallel optics module 606 may be used in a computer system, such as a server.

Parallel optics module 606 may be coupled to a processor 608 and storage 610 via a bus 612. In one embodiment, storage 610 has stored instructions executable by processor 608 to operate router 600.

Router 600 includes input ports 602 and output ports 604. In one embodiment, router 600 receives optical signals at input ports 602. The optical signals are converted to electrical signals by parallel optics module 606. Parallel optics module 606 may also convert electrical signals to optical signals and then the optical signals are sent from router 600 via output ports 604.

The above description of illustrated embodiments of the invention, including what is described in the Abstract, is not intended to be exhaustive or to limit the embodiments to the precise forms disclosed. While specific embodiments of, and examples for, the invention are described herein for illustrative purposes, various equivalent modifications are possible, as those skilled in the relevant art will recognize. These modifications can be made to embodiments of the invention in light of the above detailed description.

The terms used in the following claims should not be construed to limit the invention to the specific embodiments disclosed in the specification. Rather, the following claims are to be construed in accordance with established doctrines of claim interpretation.

What is claimed is:

1. An apparatus comprising:
a module;
at least one electronic device integral with the module;
at least one optoelectronic device integral with the module;
a common voltage source pad for the electronic and optoelectronic devices;
a first ground pad for the at least one electronic device;
a second ground pad, separate from the first ground pad, for the at least one optoelectronic device; and
one of a diode and a resistor between an anode of the at least one optoelectronic device and the common voltage source pad.

2. An apparatus comprising:
a module;
at least one electronic device integral with the module;
at least one optoelectronic device integral with the module;
a common voltage source pad for the electronic and optoelectronic devices;
a first ground pad for the at least one electronic device;
a second ground pad, separate from the first around pad, for the at least one optoelectronic device;
voltage source to apply a reverse bias voltage between the second ground pad and the common voltage source pad; and
a current meter in a path between the second ground pad and the common voltage source pad.

3. An apparatus comprising:
a module;
at least one electronic device integral with the module;
at least one optoelectronic device integral with the module;

a common voltage source pad for the electronic and optoelectronic devices;

a first ground pad for the at least one electronic device;

a second ground pad, separate from the first ground pad, for the at least one optoelectronic device, wherein the at least one optoelectronic device comprises a vertical cavity surface emitting laser (VCSEL);

a plurality of the modules on a substrate to form a parallel optics module; and a plurality of individual VCSEL grounds, one for each of said plurality o modules.

4. The apparatus as recited in claim 3 further comprising VCSEL driver circuitry and transmitter circuitry on said substrate.

5. A method comprising:

integrating an electronic device and an optoelectronic device on a die;

providing a common voltage source pad for all devices on the die;

providing a first ground pad for the electronic device;

providing a second ground pad, separate for the first ground pad, for the optoelectronic device, wherein the optoelectronic device comprises a vertical cavity surface emitting laser (VCSEL); and providing a reverse bias voltage between the common voltage source pad and the second ground pad.

6. The method as recited in claim 5 further comprising:

measuring a reverse bas current flowing through the VCSEL to determine electrostatic discharge (ESO) damage.

7. A system, comprising:

a parallel optics module comprising a plurality of singulated dies each comprising integrated electronic components and optoelectronic components positioned on a substrate;

a common voltage supply pad to supply voltage to each said die;

a common ground pad to ground said electronic components on each said die;

at least one optoelectronic ground pad, separate from the common ground pad;

a plurality of input ports for inputting signals to the parallel optics module;

a plurality of output ports to output signals from the parallel optics module;

a processor to control routing of signals from the input ports and output ports through the parallel optics module wherein the optoelectronic components comprise vertical cavity surface emitting lasers (VCSELs); and a voltage source to apply a reverse bias voltage between the at least one optoelectronic ground pad and the common voltage source pad.

8. The system as recited in claim 7 further comprising a current meter between the at least one optoelectronic ground pad and the common voltage source pad to detect a leakage current a corresponding VCSEL.

* * * * *